(12) United States Patent
Achtenberg et al.

(10) Patent No.: US 10,090,044 B2
(45) Date of Patent: Oct. 2, 2018

(54) SYSTEM AND METHOD FOR BURST PROGRAMMING DIRECTLY TO MLC MEMORY

(71) Applicant: SanDisk Technologies LLC, Plano, TX (US)

(72) Inventors: Stella Achtenberg, Netanya (IL); Alon Eyal, Zichron Yaacov (IL); Eran Sharon, Rishon Lezion (IL)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/215,862

(22) Filed: Jul. 21, 2016

(65) Prior Publication Data

US 2018/0025776 A1 Jan. 25, 2018

(51) Int. Cl.
| | | |
|---|---|---|
| G11C 29/00 | (2006.01) | |
| G11C 11/56 | (2006.01) | |
| G11C 16/10 | (2006.01) | |
| G11C 16/16 | (2006.01) | |
| G06F 11/10 | (2006.01) | |
| G11C 29/52 | (2006.01) | |

(52) U.S. Cl.
CPC ...... *G11C 11/5628* (2013.01); *G06F 11/1072* (2013.01); *G11C 16/10* (2013.01); *G11C 16/16* (2013.01); *G11C 29/52* (2013.01)

(58) Field of Classification Search
None
See application file for complete search history.

(56) References Cited

U.S. PATENT DOCUMENTS

| | | | |
|---|---|---|---|
| 7,961,517 B2 | 6/2011 | Aritome | |
| 9,182,928 B2 | 11/2015 | Gorobets et al. | |
| 9,244,631 B2 | 1/2016 | Gorobets et al. | |
| 9,268,635 B2 | 2/2016 | Sharon et al. | |
| 9,324,419 B2 | 4/2016 | Pang et al. | |
| 2010/0027329 A1* | 2/2010 | Lee .................... | G11C 8/06 365/163 |
| 2012/0155173 A1* | 6/2012 | Lee .................... | G11C 16/06 365/185.09 |
| 2012/0239858 A1* | 9/2012 | Melik-Martirosian ....... | G11C 16/349 711/103 |
| 2014/0101367 A1* | 4/2014 | Chen ................. | H04W 52/0229 711/102 |
| 2014/0281820 A1 | 9/2014 | Alrod et al. | |
| 2015/0160893 A1* | 6/2015 | Gorobets ............. | G06F 3/061 711/103 |

(Continued)

*Primary Examiner* — Daniel McMahon
(74) *Attorney, Agent, or Firm* — Brinks Gilson & Lione

(57) ABSTRACT

A memory system can program data in different modes, such as normal mode programming and burst mode programming. Burst mode programming programs data into the memory device faster than normal mode programming. MLC Blocks for burst mode programming are selected based on one or more criteria, such as block age, block programming speed, or the like. Further, one or more burst mode TRIM settings, which include one or more of a program voltage TRIM setting, a step-up voltage TRIM setting, skip verify level, and a program pulse width, are used to program the blocks selected for burst mode programming. In this regard, burst mode programming is performed more quickly than normal mode programming.

20 Claims, 13 Drawing Sheets

(56) References Cited

U.S. PATENT DOCUMENTS

| | | |
|---|---|---|
| 2015/0301763 A1* | 10/2015 | Shaharabany ........ G06F 3/0613 711/115 |
| 2015/0324119 A1 | 11/2015 | Romanovsky et al. |
| 2016/0179399 A1 | 6/2016 | Melik-Martirosian |

* cited by examiner

SYSTEM AND METHOD FOR BURST PROGRAMMING DIRECTLY TO MLC MEMORY

BACKGROUND

A memory system may be used under different conditions, which place different performance requirements on the memory in the memory system. To account for these different conditions, memories in some memory systems may be operated in a "normal" mode or in a "burst" mode, in which a higher-than-average performance by the memory system satisfies a higher-than-average number of write commands from a host controller. For example, when a memory system is part of a video camera device, raw video shot by the camera is stored in the camera's RAM, and then compressed and transferred to the memory in the memory system. In such systems, the memory matches the average rate of compressed video, and, as such, the burst mode is used to provide a write performance that matches the rate at which the video data is produced. For example, in some memory systems, the burst mode may be capable of supporting a storage rate of 160 MB/s for 4 GB, while the normal mode may support rates of up to 80 MB/s for 12 GB.

To achieve the higher-than-average performance, the memory system can store data in a single-level cell (SLC) partition instead of a multi-level cell (MLC) partition, as writing to SLC cells is faster than writing to MLC cells. Alternatively, instead of writing to a dedicated SLC partition, if the memory supports a dynamic configuration where a memory cell can be used either as an SLC cell or an MLC cell on demand, certain memory cells can be configured to be SLC cells during a burst mode. SLC mode is faster than MLC mode but consumes memory resources (i.e., the memory cells) at a rate that is at least twice the rate of MLC storage. Therefore, the capacity of a memory working in burst mode is smaller than the capacity of the memory working in non-burst mode where MLC cells would be used.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION OF PRESENTLY PREFERRED EMBODIMENTS

Overview

Figure 1A:
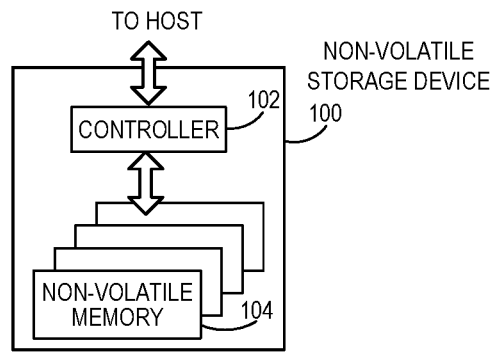
FIG. 1A is a block diagram of an exemplary non-volatile memory system.

By way of introduction, the below embodiments relate to memory systems and methods for burst programming. In one embodiment, the non-volatile memory system may include a controller and non-volatile memory. The non-volatile memory may comprise cells, into which data is programmed. The memory cells may be programmed to store one bit, or multiple bits, within a respective cell. For example, the memory cells may be operated to store two levels of charge so that a single bit of data is stored in each cell. This is typically referred to as a binary or single level cell (SLC) memory. As another example, the memory cells may be operated to store more than two detectable levels of charge in each charge storage element or region, thereby to store more than one bit of data in each. This latter configuration is referred to as multi-level cell (MLC) memory. One or both types of memory cells may be used in the memory.

As discussed in the background, the memory system may operate in a burst mode whereby the memory system is configured to store data in non-volatile memory at a faster rate than in a normal mode. Because writing data to SLC cells is faster, the data programmed in burst mode may be stored in SLC memory. However, as discussed in the background, storing data in SLC memory requires more memory allocation since only 1 bit of data may be stored per cell. Conversely, MLC memory may be used in burst mode since more bits of data per cell may be stored; however, because programming data into MLC memory is slower, using MLC memory may be disadvantageous in burst mode.

In one embodiment, data is programmed in burst mode to MLC memory with one or more programming settings being different from programming to MLC memory in normal mode. For example, when programming data into memory, the program settings may include the TRIM setting, which may include one, some, any combination, or all of the following: a program voltage TRIM setting (Vpgm); a step-up voltage TRIM setting (dVpgm); skip verify level (e.g., how many programming pulses are input before verifying a certain level of voltage); and a program pulse width (PPW). Other or different program settings are contemplated. In this regard, the various components of a specific TRIM setting (e.g., Vpgm, dVpgm, skip verify level, and PPW) may affect the speed at which data, using the specific TRIM setting, is programmed. As discussed herein, different operations, such as burst mode, may seek greater speeds at which to program the data. In this regard, a burst mode TRIM setting (or multiple burst mode TRIM settings) may be used to program data during the burst mode.

For example, in a specific embodiment, a burst mode TRIM setting is used to program data into MLC in burst mode. The burst mode TRIM setting includes at least one difference from a normal mode TRIM setting used to program data into MLC in normal mode. For example, Vpgm may be more aggressive for the burst mode TRIM setting than Vpgm for the normal mode TRIM setting (e.g., Vpgm in burst mode is a higher voltage than Vpgm in normal mode). As another example, dVpgm may be more aggressive for the burst mode TRIM setting than dVpgm for the normal mode TRIM setting (e.g., dVpgm in burst mode is a larger voltage difference than dVpgm in normal mode). Skip verify in burst mode may be more aggressive than in normal mode. In this way, one, some, or all of the following skip verify procedures may be applied during burst mode: verify fewer levels than the number of levels verified during skip verify in normal mode; begin verifying after more programming pulses were applied than applied during skip verify in normal mode; or increasing the number of bits that do not pass verify than during skip verify in normal mode. As still another example, PPW may be different for the burst mode TRIM setting than PPW for the normal mode TRIM setting (e.g., PPW in burst mode is greater than PPW in normal mode). In this regard, the burst mode TRIM setting may include any one, any combination, or all of Vpgm, dVpgm, skip verifies, bit ignore or PPW being different than the normal mode TRIM setting.

As discussed above, in one embodiment, a single more aggressive burst mode TRIM setting is used during burst mode. In an alternative embodiment, a plurality of more aggressive burst mode TRIM settings may be used. The different burst mode TRIM settings may vary from one another in any one, some, or all of the Vpgm, dVpgm, skip verifies, bit ignore or PPW, and may have different corresponding ECC codes. Further, the different burst mode TRIM settings may have different speeds at which data is programmed and/or different effects on the cells (e.g., a first burst mode TRIM setting that is more aggressive may have a greater aging effect on the cells than a second burst mode TRIM setting that is less aggressive). In this regard, selecting a specific burst mode TRIM setting, from amongst the plurality of burst mode TRIM settings, may be dependent on the required performance (e.g., the speed at which data is to be programmed) and dependent on the wear of the block (e.g., selected for wear leveling purposes so that the blocks have the same or similar reliability).

Using the burst mode TRIM setting (whether a single available burst mode TRIM setting or selected from a plurality of burst mode TRIM settings), which is a more aggressive TRIM setting than the normal mode TRIM setting, may result in more errors in programming the data into MLC. To compensate for the higher number of errors, a greater number of error correction data may be generated. For example, error correction coding data (ECC data) may be generated for use by an ECC engine to correct for errors in programming the data. As discussed in more detail below, one example of ECC data is parity bits, with the number of parity bits used when programming in burst mode being higher than the number of parity bits used when programming in normal mode. In a more specific embodiment, burst programming may be performed directly to MLC and protected temporarily by a larger number of parity bits, thereby resulting in a Tunable ECC approach. The memory system may thereafter be configured to copy the programmed data to regular blocks offline (with regular parity protection that is less than the larger number of parity bits used for burst programming). For example, the number of parity bits in burst mode may be doubled (or more) compared to the amount used in the normal mode, such that the parity bits are up to 20% or 30% of the programmed data, thus providing improved ECC capabilities as high as about 5%-10% BER. In this regard, in one embodiment, more ECC data (such as more parity bits) are generated when programming in burst mode than when programming in normal mode.

In a more specific embodiment, the ECC data generated (including the amount of ECC data generated) may be dependent on the type of burst mode programming performed. Different types of burst mode programming may depend on: the number of bits programmed per cell (e.g., SLC versus MLC); the criteria to select the blocks for burst mode programming (e.g., the age indicator of the blocks); and/or the TRIM setting used in burst mode programming (e.g., more aggressive TRIM parameters result in more errors, and in turn a need for more ECC data to compensate). As one example, one type of burst mode programs data into SLC memory whereas another type of burst mode programs data into MLC memory. A larger number of errors may result when programming to MLC versus SLC memory, and in turn necessitate a greater number of ECC data to compensate. As another example, one type of burst mode selects blocks for programming that have an age indicator indicative of an older block, whereas another type of burst mode selects blocks for programming that have an age indicator indicative of a younger block. As still another example, more aggressive TRIM parameters may result in a larger number of errors, and in turn necessitate a greater number of ECC data to compensate.

After programming the data into non-volatile memory (e.g., into MLC memory) in the burst mode, the data may be copied into memory, such as MLC memory, in a normal mode. The normal mode programming process may differ from the burst mode programming process in one or more ways. For example, in one embodiment, the direct MLC programming in burst mode is different from the normal mode in one or more respects, including any one, any combination, or all of the following: TRIM setting used; ECC data generated (e.g., the amount of ECC data generated); and/or criteria for selection of blocks to write data into. As one example, the burst mode TRIM setting to program directly to MLC memory may be at least partly different from the TRIM setting used in the normal mode to program directly to MLC memory. As another example, the amount of ECC data generated in the burst mode is greater than the amount of ECC data generated in the normal mode.

As discussed above, burst mode is more focused on speed of programming than on wear to the memory. Thus, in one embodiment, an age indicator is analyzed to determine which block(s) to select for burst mode programming. Various age indicators may be used. For example, the number of programming pulses (NLP number) associated with a block may be analyzed, with a lower NLP number indicating a more aged block and a higher NLP number indicating a less aged block. As another example, the number of erase pulses (NLE number) associated with a block may be analyzed, with a higher NLE number indicating a more aged block and a lower NLE number indicating a less aged block. The reason for the inversed relation between fresher blocks and the NLP value is that blocks indicative of greater age have "deep trapped" electrons that elevate the cells Vt such that fewer program pulses suffice to program cells. As yet another example, the program/erase (P/E) cycles may be an indicator of the age of the block, with a higher P/E cycle count indicative of a more aged block.

In a first specific embodiment, part or all of the free blocks available for burst mode programming may be sorted or ranked based on the age indicator, with the blocks indicating a younger age selected for burst mode programming before the blocks indicating an older age. Though younger blocks take longer to program (as indicative of the NLP number), the younger blocks may be subjected to a more aggressive TRIM while suffering less aging effects than the older blocks.

In a second specific embodiment, part or all of the free blocks available for burst mode programming may be sorted based on the age indicator, with the blocks indicating an older age selected for burst mode programming before the blocks indicating a younger age. Though older blocks may suffer greater aging effects when subjected to a more aggressive TRIM, the older blocks may program quicker (as indicated by the lower NLP number). In this regard, when selecting older blocks for burst mode programming, a less aggressive TRIM may be used than the TRIM used for burst mode programming using younger blocks.

Alternatively, or in addition, the historical NLP value may be recorded per word line and used to begin programming with a higher initial programming voltage. For example, the historical NLP value may be used to select one or more aspects of the TRIM, such as Vpgm (e.g., the historical NLP value may be used to select a higher Vpgm to begin programming, thereby improving performance). In this way, burst mode programming may be faster and therefore more improved.

Further, the NLE value may likewise be used in addition to (or instead of) the NLP value. In particular, blocks with a low NLE value are indicative of fresher blocks that may be selected for high performance burst programming and may also be programmed with higher programming TRIM.

Other embodiments are possible, and each of the embodiments can be used alone or together in combination. Accordingly, various embodiments will not be described with reference to the attached drawings.

Exemplary Embodiments

The following embodiments describe non-volatile memory systems and related methods for burst mode programming. Before turning to these and other embodiments, the following paragraphs provide a discussion of exemplary non-volatile memory systems and storage modules that can be used with these embodiments. Of course, these are just examples, and other suitable types of non-volatile memory systems and/or storage modules can be used.

FIG. 1A is a block diagram illustrating a non-volatile memory system 100. The non-volatile memory system 100 may include a controller 102 and non-volatile memory that may be made up of one or more non-volatile memory dies 104. As used herein, the term die refers to the set of non-volatile memory cells, and associated circuitry for managing the physical operation of those non-volatile memory cells, that are formed on a single semiconductor substrate. The controller 102 may interface with a host system and transmit command sequences for read, program, and erase operations to the non-volatile memory die(s) 104.

The controller 102 (which may be a flash memory controller) can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 102 and the non-volatile memory die(s) 104 may be any suitable flash interface, such as Toggle Mode 200, 400, or 800. In one embodiment, the memory system 100 may be a card based system, such as a secure digital (SD) or a micro secure digital (micro-SD) card. In an alternate embodiment, the system 100 may be part of an embedded memory system.

Although in the example illustrated in FIG. 1A, the non-volatile memory system 100 may include a single channel between the controller 102 and the non-volatile memory die(s) 104, the subject matter described herein is not limited to having a single memory channel. For example, in some NAND memory system architectures, 2, 4, 8 or more NAND channels may exist between the controller and the NAND memory die(s) 104, depending on controller capabilities. In any of the embodiments described herein, more than a single channel may exist between the controller and the memory die(s) 104, even if a single channel is shown in the drawings.

Figure 1B:
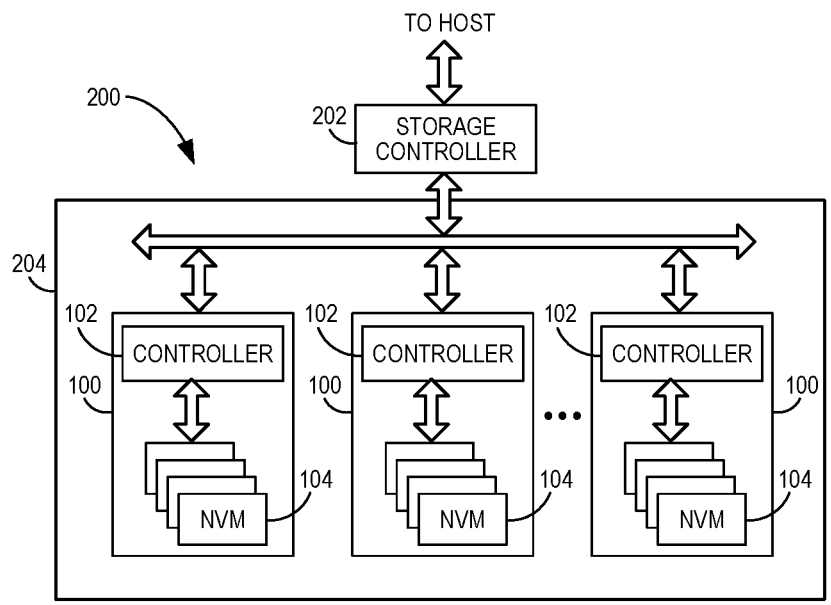
FIG. 1B is a block diagram of a storage module that includes a plurality of non-volatile memory systems.

FIG. 1B illustrates a storage module 200 that includes plural non-volatile memory systems 100. As such, the storage module 200 may include a storage controller 202 that interfaces with a host and with a storage system 204, which includes a plurality of non-volatile memory systems 100. The interface between the storage controller 202 and non-volatile memory systems 100 may be a bus interface, such as a serial advanced technology attachment (SATA), a peripheral component interface express (PCIe) interface, an embedded MultiMediaCard (eMMC) interface, a SD interface, or a Universal Serial Bus (USB) interface, as examples. The storage system 200, in one embodiment, may be a solid state drive (SSD), such as found in portable computing devices, such as laptop computers and tablet computers, and mobile phones.

Figure 1C:
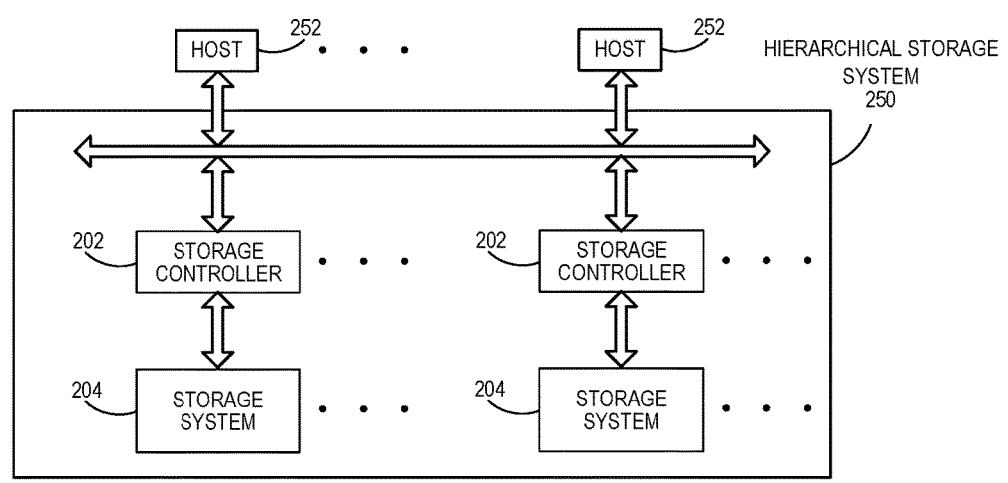
FIG. 1C is a block diagram of a hierarchical storage system.

FIG. 1C is a block diagram illustrating a hierarchical storage system 250. The hierarchical storage system 250 may include a plurality of storage controllers 202, each of which control a respective storage system 204. Host systems 252 may access memories within the hierarchical storage system 250 via a bus interface. Example bus interfaces may include a non-volatile memory express (NVMe), a fiber channel over Ethernet (FCoE) interface, an SD interface, a USB interface, a SATA interface, a PCIe interface, or an eMMC interface as examples. In one embodiment, the hierarchical storage system 250 illustrated in FIG. 1C may be a rack mountable mass storage system that is accessible by multiple host computers, such as would be found in a data center or other location where mass storage is needed.

Figure 2A:
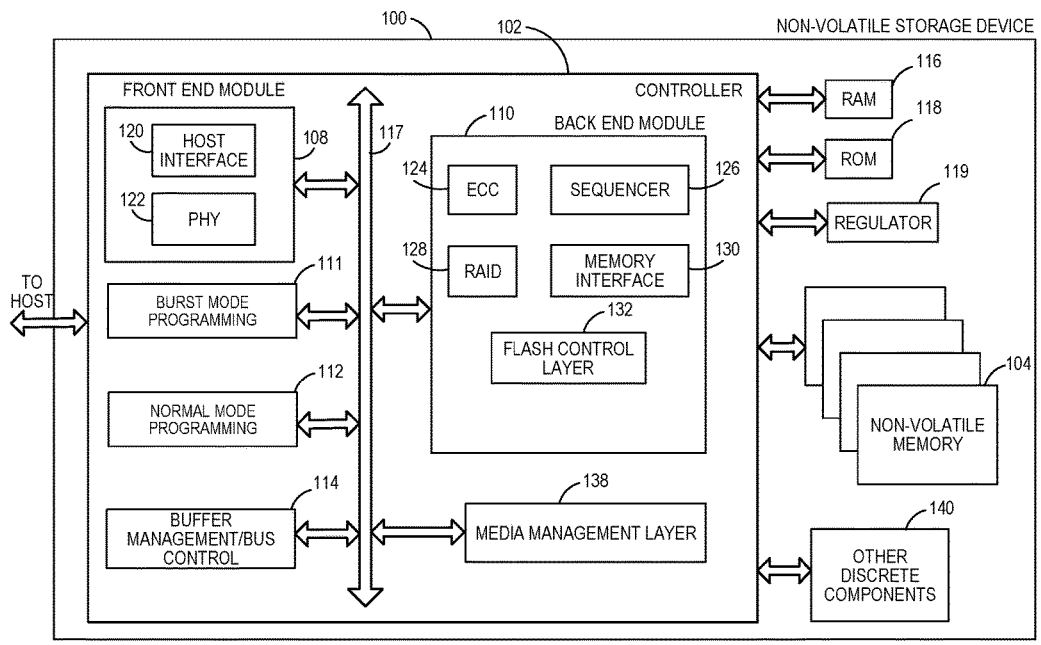
FIG. 2A is a block diagram of exemplary components of a controller of the non-volatile memory system of FIG. 1A.

FIG. 2A is a block diagram illustrating exemplary components of the controller 102 in more detail. The controller 102 may include a front end module 108 that interfaces with a host, a back end module 110 that interfaces with the non-volatile memory die(s) 104, and various other modules that perform various functions of the non-volatile memory system 100. In general, a module may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition or alternatively, each module may include memory hardware that comprises instructions executable with a processor or processor circuitry to implement one or more of the features of the module. When any one of the module includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 102 may include a buffer manager/bus controller module 114 that manages buffers in random access memory (RAM) 116 and controls the internal bus arbitration for communication on an internal communications bus 117 of the controller 102. A read only memory (ROM) 118 may store and/or access system boot code. Although illustrated in FIG. 2A as located separately from the controller 102, in other embodiments one or both of the RAM 116 and the ROM 118 may be located within the controller 102. In yet other embodiments, portions of RAM 116 and ROM 118 may be located both within the controller 102 and outside the controller 102. Further, in some implementations, the controller 102, the RAM 116, and the ROM 118 may be located on separate semiconductor dies.

Additionally, the front end module 108 may include a host interface 120 and a physical layer interface (PHY) 122 that provide the electrical interface with the host or next level storage controller. The choice of the type of the host interface 120 can depend on the type of memory being used. Examples types of the host interface 120 may include, but are not limited to, SATA, SATA Express, SAS, Fibre Channel, USB, PCIe, and NVMe. The host interface 120 may typically facilitate transfer for data, control signals, and timing signals.

The back end module 110 may include an error correction controller (ECC) engine 124 that encodes the data bytes received from the host, and decodes and error corrects the data bytes read from the non-volatile memory die(s) 104. As discussed in more detail below, the ECC engine may be tunable, such as to generate different amounts of ECC data based on the mode (e.g., generate normal mode ECC data in normal programming mode and generate burst mode ECC data in burst programming mode, with the burst mode ECC data being greater than the normal mode ECC data). The back end module 110 may also include a command sequencer 126 that generates command sequences, such as program, read, and erase command sequences, to be transmitted to the non-volatile memory die(s) 104. Additionally, the back end module 110 may include a RAID (Redundant Array of Independent Drives) module 128 that manages generation of RAID parity and recovery of failed data. The RAID parity may be used as an additional level of integrity protection for the data being written into the non-volatile memory system 100. In some cases, the RAID module 128 may be a part of the ECC engine 124. A memory interface 130 provides the command sequences to the non-volatile memory die(s) 104 and receives status information from the non-volatile memory die(s) 104. Along with the command sequences and status information, data to be programmed into and read from the non-volatile memory die(s) 104 may be communicated through the memory interface 130. In one embodiment, the memory interface 130 may be a double data rate (DDR) interface, such as a Toggle Mode 200, 400, or 800 interface. A flash control layer 132 may control the overall operation of back end module 110.

Additional modules of the non-volatile memory system 100 illustrated in FIG. 2A may include a media management layer 138, which performs wear leveling of memory cells of the non-volatile memory die 104. The non-volatile memory system 100 may also include other discrete components 140, such as external electrical interfaces, external RAM, resistors, capacitors, or other components that may interface with controller 102. In alternative embodiments, one or more of the RAID module 128, media management layer 138 and buffer management/bus controller 114 are optional components that may not be necessary in the controller 102.

Additional modules of the non-volatile memory system 100 illustrated in FIG. 2A may include burst mode programming 111 and normal mode programming 112. These modules are shown as separate from the other modules of the non-volatile memory system 100, although in other configurations, one or more of them may be part of any of the other modules.

Figure 2B:
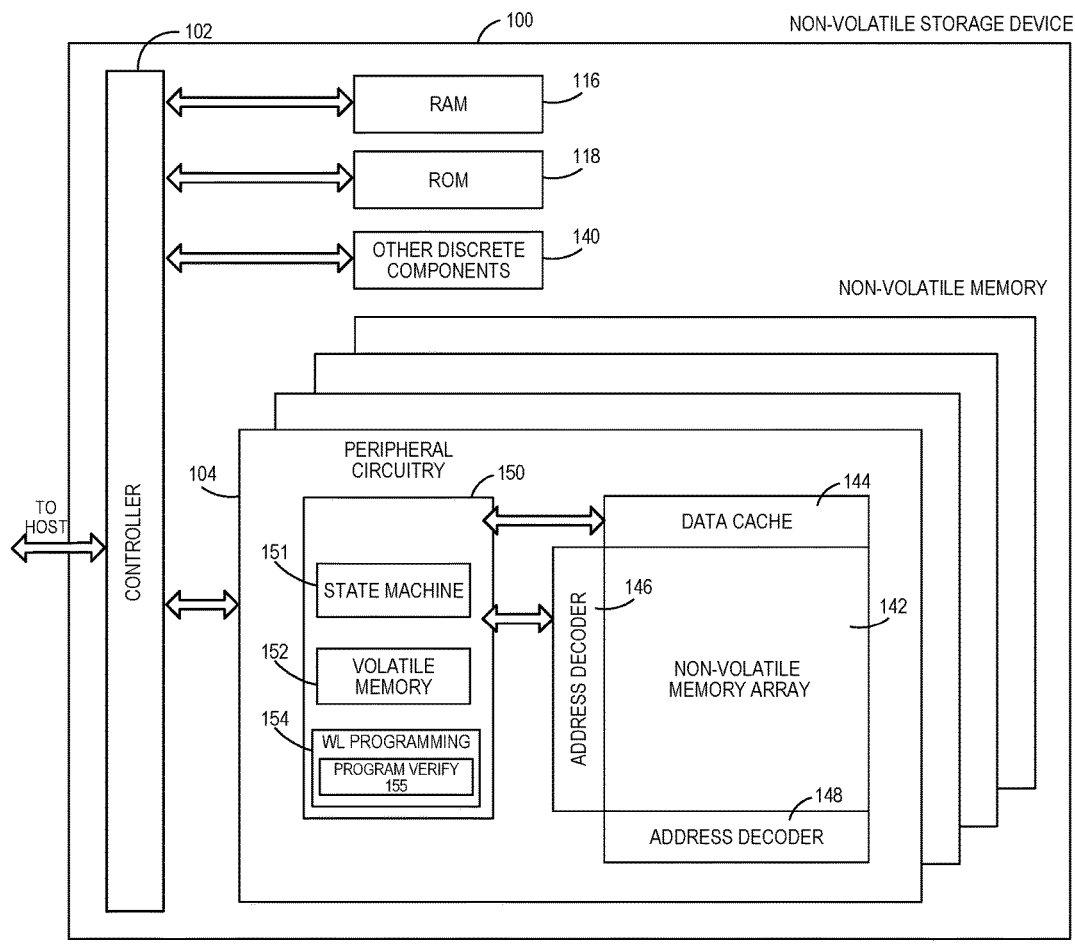
FIG. 2B is a block diagram of exemplary components of a non-volatile memory die of the non-volatile memory system of FIG. 1A.

FIG. 2B is a block diagram illustrating exemplary components of a non-volatile memory die 104 in more detail. The non-volatile memory die 104 may include a non-volatile memory array 142. The non-volatile memory array 142 may include a plurality of non-volatile memory elements or cells, each configured to store one or more bits of data. The non-volatile memory elements or cells may be any suitable non-volatile memory cells, including NAND flash memory cells and/or NOR flash memory cells in a two dimensional and/or three dimensional configuration. The memory cells may take the form of solid-state (e.g., flash) memory cells and can be one-time programmable, few-time programmable, or many-time programmable. In addition, the memory elements or cells may be configured as single-level cells (SLCs) that store a single bit of data per cell, multi-level cells (MLCs) that store multiple bits of data per cell, or combinations thereof. For some example configurations, the multi-level cells (MLCs) may include triple-level cells (TLCs) that store three bits of data per cell.

Additionally, a flash memory cell may include in the array 142 a floating gate transistor (FGT) that has a floating gate and a control gate. The floating gate is surrounded by an insulator or insulating material that helps retain charge in the floating gate. The presence or absence of charges inside the floating gate may cause a shift in a threshold voltage of the FGT, which is used to distinguish logic levels. That is, each FGT's threshold voltage may be indicative of the data stored in the memory cell. Hereafter, FGT, memory element and memory cell may be used interchangeably to refer to the same physical entity.

The memory cells may be disposed in the memory array 142 in accordance with a matrix-like structure of rows and columns of memory cells. At the intersection of a row and a column is a FGT (or memory cell). A column of FGTs may be referred to as a string. FGTs in a string or column may be electrically connected in series. A row of FGTs may be referred to as a page. Control gates of FGTs in a page or row may be electrically connected together.

The memory array 142 may also include wordlines and bitlines connected to the FGTs. Each page of FGTs is coupled to a wordline. In particular, each wordline may be coupled to the control gates of FGTs in a page. In addition, each string of FGTs may be coupled to a bitline. Further, a single string may span across multiple wordlines, and the number of FGTs in a string may be equal to the number of pages in a block.

The non-volatile memory die 104 may further include a page buffer or data cache 144 that caches data that is sensed from and/or that is to be programmed to the memory array 142. The non-volatile memory die 104 may also include a row address decoder 146 and a column address decoder 148. The row address decoder 146 may decode a row address and select a particular wordline in the memory array 142 when reading or writing data to/from the memory cells in the memory array 142. The column address decoder 148 may decode a column address to select a particular group of bitlines in the memory array 142 to be electrically coupled to the data cache 144.

In addition, the non-volatile memory die 104 may include peripheral circuitry 150. The peripheral circuitry 150 may include a state machine 151 that provides status information to the controller 102. Other functionality of the state machine 151 is described in further detail below. The peripheral circuitry 150 may also include volatile memory 152. An example configuration of the volatile memory 152 may include latches, although other configurations are possible. Likewise, non-volatile memory die 104 may further include wordline programming module 154 configured to program a respective wordline in non-volatile memory array 142. Wordline programming module may include a program verify module 155. Program verify module 155 may include program verify functionality, such as discussed in more detail below.

Figure 3A:
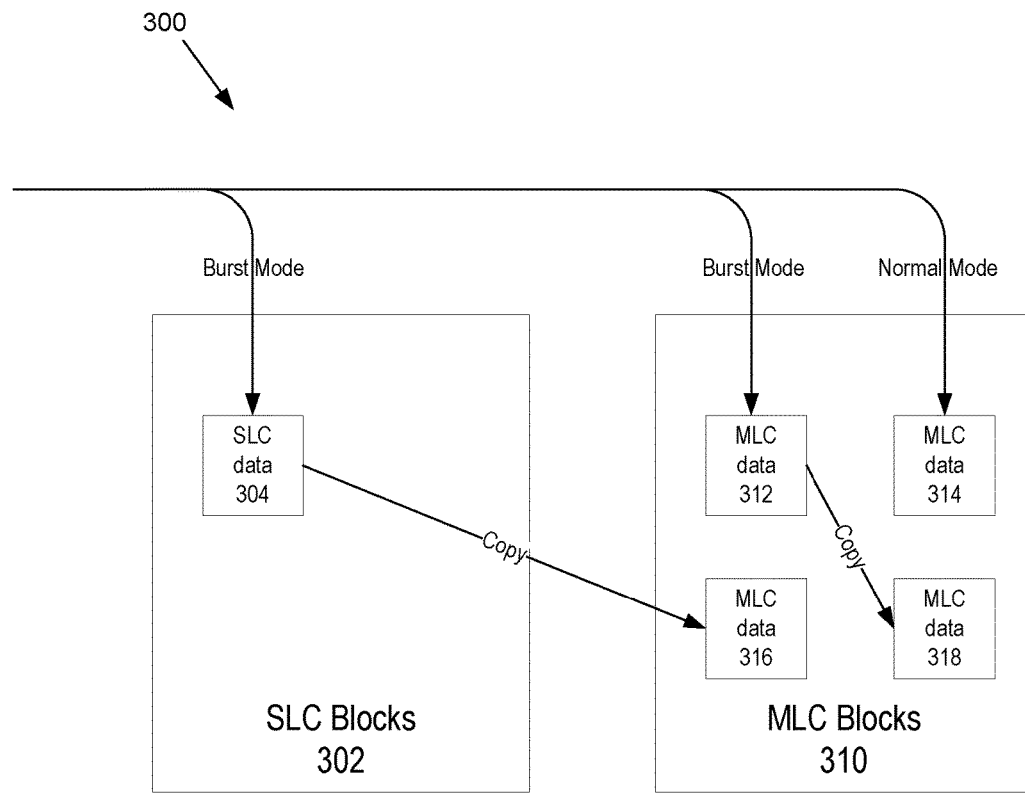
FIG. 3A is a block diagram of exemplary writes to SLC blocks and MLC blocks in burst mode and normal mode.

As discussed above, the data programmed in the burst mode may be stored in SLC memory, in hybrid memory (e.g. programmable as either SLC data or MLC data), or in MLC memory. FIG. 3A is a block diagram 300 of exemplary writes to SLC blocks 302 and MLC blocks 310 in burst mode and normal mode. As shown, in burst mode, the data may be stored as SLC data 304 within SLC blocks 302. For example, after SLC blocks 302 are filled with data, in burst mode, the data may be stored as MLC data 312 within MLC blocks 310. Further, data in the normal mode may be stored as MLC data 314 in MLC blocks 310. After the data (e.g., SLC data 304 or MLC data 312) is stored during burst mode, an offline copy may be performed to MLC, such as to MLC data 316 or MLC data 318.

Figure 3B:
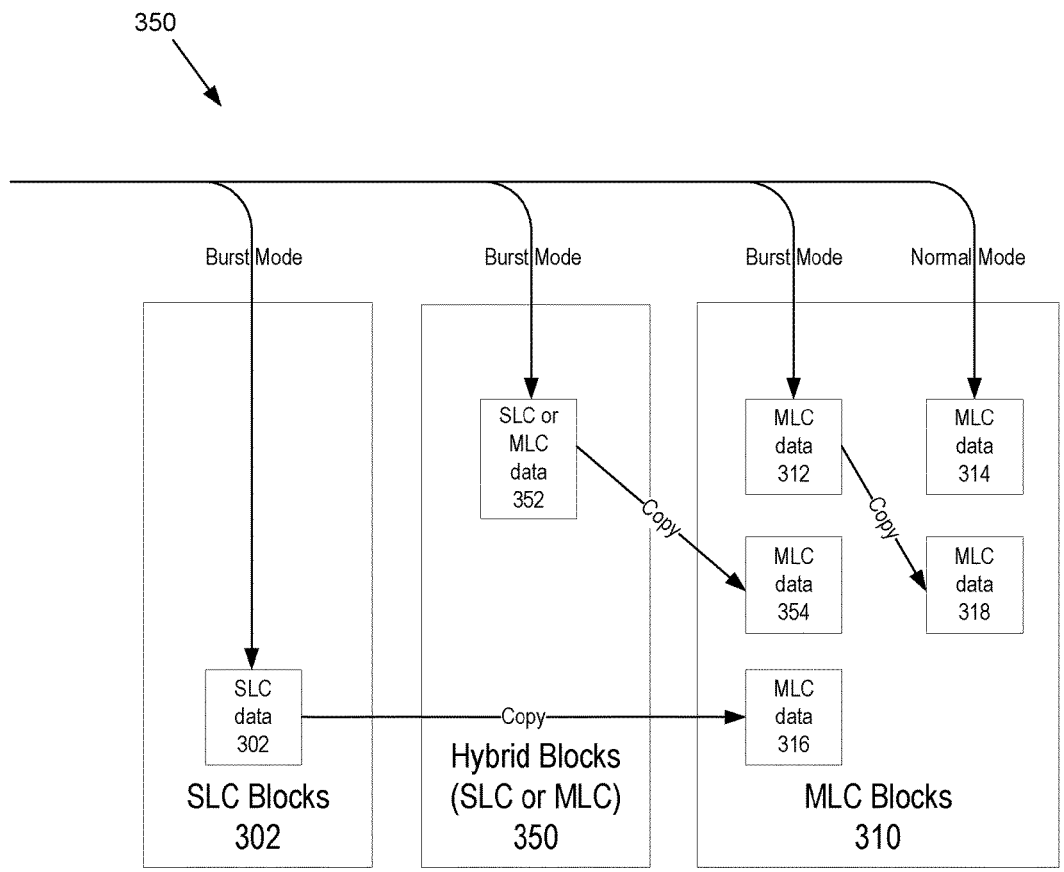
FIG. 3B is a block diagram of exemplary writes to SLC blocks, hybrid blocks and MLC blocks in burst mode and normal mode.

FIG. 3B is a block diagram 350 of exemplary writes to SLC blocks 302, hybrid blocks 350 and MLC blocks 310 in burst mode and normal mode. As shown, hybrid blocks 350 may store either SLC or MLC data 352. Further, after the data (e.g., SLC or MLC data 352) is stored during burst mode, an offline copy may be performed to MLC, such as to MLC data 354.

Figure 4A:
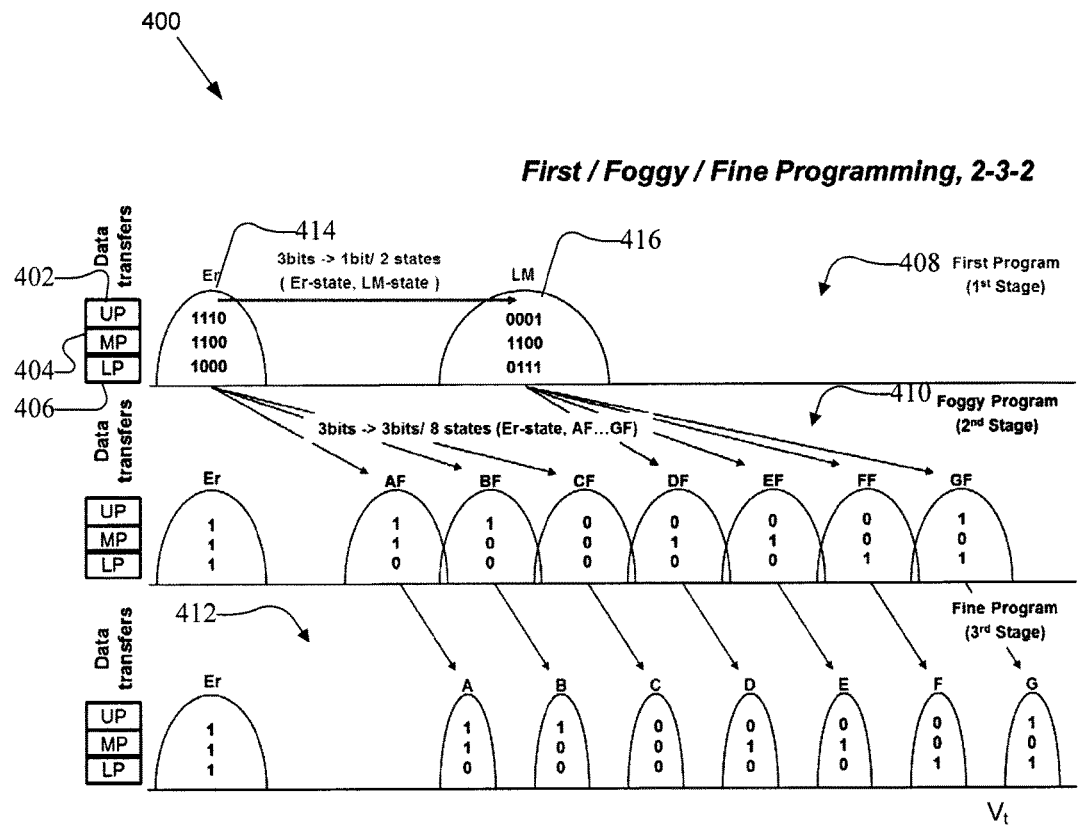
FIG. 4A illustrates an example non-volatile memory programming chart showing target voltage levels for each stage of a three stage NAND flash programming operation in a three bit-per-cell memory.

As discussed above, data may be programmed into MLC, such as in a burst mode or in a normal mode. Programming data into MLC may be performed in one of several ways. FIG. 4A illustrates one example 400 of MLC programming, in which 3-bits-per-cell are programmed into NAND flash memory. The example 400 of FIG. 4A is merely for illustration purposes. Other numbers of bits-per-cell and other types of memory are contemplated. Referring to FIG. 4A, each cell in a WL for a 3 bits-per-cell NAND flash memory may store a bit from each of 3 different pages: an upper page bit (UP) 402, a middle page bit (MP) 404 and a lower page bit (LP) 406. A typical programming operation for such a memory cell would require that the 3 original bits of host data intended for that cell be transferred from the controller to the NAND memory three times, one time for each of three programming passes needed to nudge the correct amount of charge into the cell to reach the desired voltage state without overshooting the desired voltage state.

As indicated in FIG. 4A, the three programming passes or states may be referred to herein as the first programming pass 408, the foggy programming pass 410 and the fine programming pass 412, respectively. Generally speaking, the first programming pass 408 will be a cruder voltage pulse that leaves the stored voltage at either an Erased (Er) 414 level or an intermediate level (LM 416 in FIG. 4A) where the Er voltage level permits subsequent continued programming into one of the first 4 of the 8 desired voltage states (Er, A, B or C) and the LM voltage level pushes the voltage to a threshold that can be increased to one of the latter 4 of the 8 desired voltage states (D, E, F or G).

In a typical first/foggy/fine programming scheme in the memory such as illustrated in FIG. 4A, the original 3 host bits are repeatedly sent from the controller to the NAND to perform each of the three programming stages. Thus, in the second or "foggy" programming step the UP, MP, and LP data are again sent from controller to NAND memory. The UP, MP and LP bits are used by the non-volatile memory (e.g. NAND flash) to generate the foggy programming stage voltage pulses needed to push the current state (Er or LM) achieved in the first programming step 408 to a more resolved 1 of the 8 desired states. The hypothetical voltage distribution options, along with the associated state of the 3 page bits at that voltage level, after foggy programming 410 are shown in FIG. 4A. After the second round of transmitting the original 3 bits of data to NAND memory and carrying out the second, or foggy, programming stage 410, the original three bits are again retrieved from RAM in the controller and sent to the NAND to provide the last, or fine, programming steps 412 necessary to achieve the desired 1 of the 8 states. A distribution for the possible programming voltages achieved after the fine programming stage 412 are shown in FIG. 4A, where the 8 possible states are shown fully restored.

After applying the programming voltage, the program verify functionality may use a set of predetermined voltages to determine whether the cell has been properly programmed. For exemplary purposes, the verify voltage levels for the 3-bit-per cell NAND flash memory, from A to G, may comprise, in a normal TRIM setting, 0.8, 1.6, 2.4, 3.2, 4.0, 4.8, 5.6V. As discussed in more detail below, a burst mode TRIM setting may have different values. In the event that the program verify fails, the initial programming voltage may, in the normal mode, be increased (e.g., by 40 mV), and the process may be repeated. Again, the voltage increase in a burst mode may be different (e.g., greater) than the voltage increase in the normal mode. In one embodiment, the number of repeats of the process may be limited to a predetermined number. After which, the memory chip may report a failure to the memory system controller, as discussed in more detail below. This process may be repeated for each of states A through G.

Figure 4B:
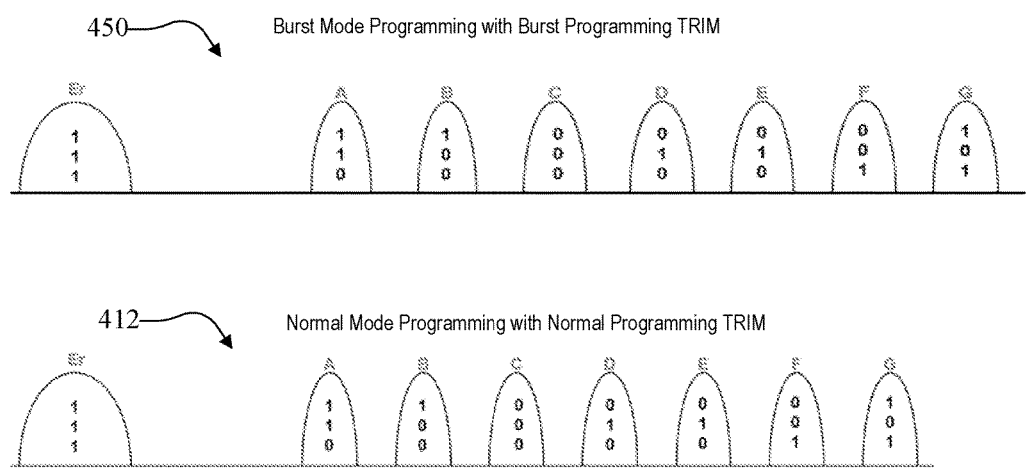
FIG. 4B illustrates eight target states in the three bit-per-cell memory for burst mode programming with the burst mode programming TRIM and normal mode programming with the normal mode programming TRIM.

As discussed above, using different TRIM settings results in different distribution of states and/or different widths of states. FIG. 4B illustrates eight target states 450 in the three bits-per-cell memory for burst mode programming with the burst mode programming TRIM and eight target states 412 in the three bit-per-cell memory normal mode programming with the normal mode programming TRIM. In particular, as discussed above with regard to FIG. 4A, after the fine programming pass 412 in the normal programming, the distribution of states is a shown in the bottom graph. FIG. 4B reproduces the bottom graph illustrated in FIG. 4A, and also includes the distribution of states 450 after the burst mode programming. In one embodiment, programming the distribution of states 450 in the burst mode programming is not performed by the first/foggy/fine programming. Rather, a first step uses Vpgm, and thereafter dVpgm in incremental steps. Further, in a first specific embodiment, a program verify is thereafter performed. Alternatively, no program verify step is performed.

As shown, the states, such as states A, B. C, D, E, F, and G, after burst mode programming are distributed more widely than the states after normal mode programming. Further, the individual states may have a wider distribution from burst mode programming than from normal programming. For example, state A in the burst mode programming is wider than in the normal mode programming. Thus, as illustrated, the distributions of MLC states are different for the burst mode programming and the normal mode programming.

The long burst direct MLC programming illustrated in FIGS. 4A-B may improve the performance in burst mode programming over normal mode programming; however, the direct MLC programming will be slower than direct SLC programming. In this regard, the combination of a more aggressive direct MLC programming TRIM and much higher parity bit protection may allow faster programming compared to normal MLC programming, since direct MLC programming may be performed with wider cell distribution widths, and hence may meet the high speed requirement of burst mode programming.

Further, in one embodiment, the long burst direct MLC programming may be used in conjunction with SLC burst programming, whereby, in the event that burst programming is ongoing and the SLC free blocks in the pool are about to end, the memory system may switch to the long burst direct TLC programming described herein.

Figure 5:
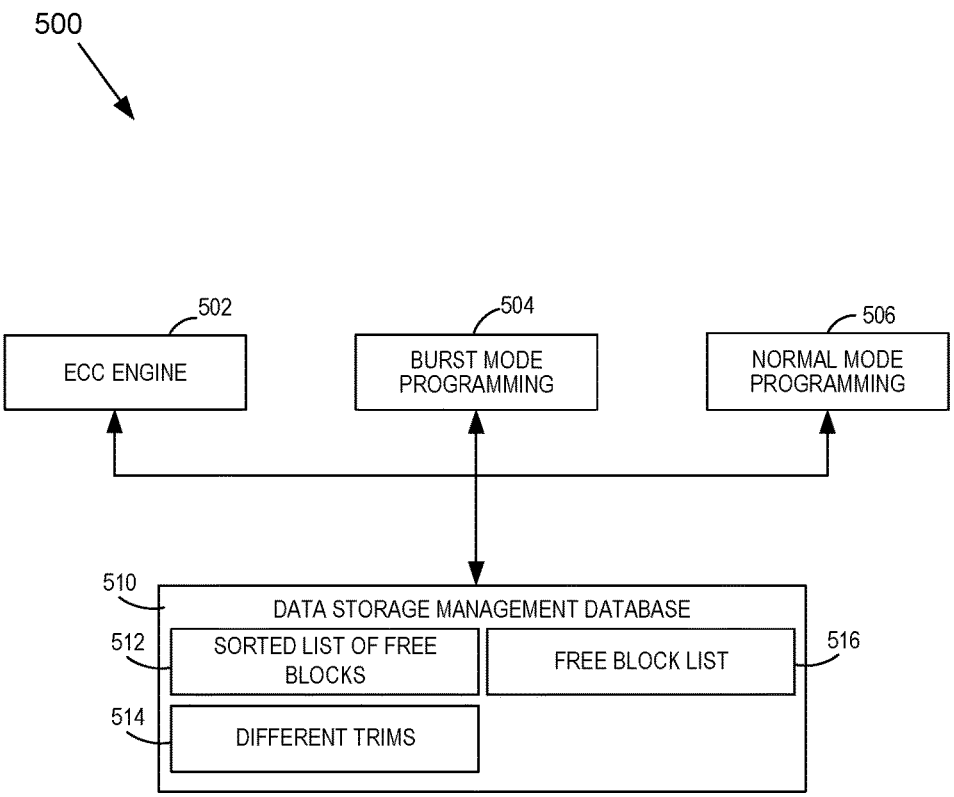
FIG. 5 is a block diagram of exemplary modules of the controller of FIG. 2A used to perform burst mode programming and normal mode programming.

FIG. 5 is a block diagram 500 of exemplary modules of the controller of FIG. 2A used to perform burst mode programming. As discussed above, a memory system may use error correcting code (ECC) techniques to correct a number of errors up to a certain error correction capability of the particular ECC technique used to encode the data. If the number of errors exceeds the error correction capability of the particular ECC technique used, an uncorrectable ECC (UECC) error may occur, resulting in data loss. One type of ECC technique may include an error correcting code (ECC) engine 502. The ECC engine 502 may include an encoder and a decoder. In operation, a controller, such as controller 102, may receive data to be stored at the non-volatile memory die(s) 104. For example, the controller 102 may receive data from the host device to be stored at the non-volatile memory die(s) 104. In response to receiving the data, the controller 102 may input the data to the ECC engine 502 to generate ECC data. In one specific embodiment, the controller 102 may input the data to the ECC engine 502 to be encoded (e.g., to generate one or more ECC codewords). Thus, in one embodiment, the ECC engine 502 may include an encoder, such as any one of the following: a Reed-Solomon (RS) encoder; a Bose-Chaudhuri-Hocquenghem (BCH) encoder; a low-density parity check (LDPC) encoder; a turbo encoder; an encoder configured to encode data according to one or more other ECC techniques; or any combination thereof. The encoder may thus encode the data bits to generate a logical page that includes the data bits and ECC bits.

In a particular embodiment, the memory system may perform an exclusive-OR (XOR) operation using bits of the logical pages to generate parity bits. For example, the parity bits may be generated by performing a bit-wise XOR operation between the logical pages. Depending on the particular implementation, the non-volatile memory die(s) 104 or the controller 102 may be configured to generate the parity bits. As an example, the controller 130 may be configured to perform XOR operations to generate the parity bits 128. To illustrate, the ECC engine 502 may be configured to perform XOR operations to generate the parity bits. Alternatively or in addition, the read/write circuitry may be configured to perform XOR operations to generate the parity bits. The parity bits may be stored at the physical page by writing data (e.g., by programming storage elements of the physical page), such as one or more logical pages that can be sensed using the read/write circuitry.

The controller 102 may access the ECC data by performing a read. For example, in response to the read command, the read/write circuitry may sense the physical page to generate sensed data corresponding to the logical page. The non-volatile memory die(s) 104 may send the sensed logical page to the controller 102. The sensed logical page may include data bits and may further include ECC data.

The controller 102 may input the sensed logical page to a decoder to decode the sensed logical page. The decoder may be configured to decode data read from the non-volatile memory die(s) 104 to detect and correct, up to an error correction capability of an ECC technique used by the ECC engine 502, bit errors that may be present in the read data.

Thus, the sensed logical page may include one or more bit errors, such as bit errors caused during writing of the logical page (e.g., over-programming or under-programming), bit errors caused during storage of the logical page (e.g., noise and cross coupling effects), and/or bit errors caused during reading of the logical page (e.g., read errors).

FIG. 5 further includes burst mode programming 504 and normal mode programming 506. While in the burst mode, controller 102 may use burst mode programming 504 in order to select the blocks for programming during burst mode and for accessing ECC engine 502 to generate ECC data. In particular, burst mode programming 504 may access free block list 516 in data storage management database 510.

Free block list 516 may comprise the blocks that are free and into which data from burst mode programming may be stored. Burst mode programming 504 may sort the free block list 516 into a sorted list of free blocks 512 based on one or more criteria. In one embodiment, the free block list 516 may be sorted based on an age indicator, such as NLP or NLE, as discussed above. Thus, when selecting blocks for burst mode programming, burst mode programming 504 may select blocks from the sorted list of free blocks 512 that meet the desired age indicator (e.g., blocks that are indicative of being younger). Further, when programming, burst mode programming 504 may access different TRIMs 514. In one embodiment, different TRIMs, such as normal mode programming TRIM, MLC burst mode programming TRIM, SLC burst mode programming TRIM, are not dependent on the age of the blocks subject to programming. Alternatively, one, some or all of the TRIMs may be dependent on the age of the blocks subject to programming. For example, a first MLC burst mode programming TRIM may be used for the first 300 cycles of a block subject to programming, in which a first Vpgm and a first dVpgm are used. After which, a second MLC burst mode programming TRIM may be used for block subject to programming, in which a second Vpgm and a second dVpgm are used, with the first Vpgm being different from the second Vpgm, and with the first dVpgm being different from the second dVpgm.

Thus, the look-up table may indicate that for the first 300 cycles, the burst mode programming uses X Vpgm and Y dVpgm. After the first 300 cycles, the burst mode programming is increased to X' Vpgm and to Y' dVpgm. As still another example, Vpgm and dVpgm may be increased again after 500 cycles. In this regard, the programming may be considered adaptive.

In particular, burst mode programming 504 may access a burst programming TRIM, which may include the Vpgm, dVpgm, and PPW to use during burst mode programming. As discussed above, because of the additional parity bits, a higher BER may be tolerated. In this way, due to the higher tolerable BER and the offline copy, the direct TLC programming may be performed with more aggressive programming TRIM, such as where both Vpgm and dVpgm may use higher values (e.g., 14V initial step and 600 mV per step size) comparing to normal programming TRIM (e.g., 12 V and 400 mV per step size).

While in the normal mode, controller 102 may use normal mode programming 506 in order to select the blocks for programming during normal mode and for accessing ECC engine 502 to generate ECC data. When programming, normal mode programming 506 may access different TRIMs 514. In particular, normal mode programming 506 may access a burst programming TRIM, which may include the Vpgm, dVpgm, and PPW to use during normal mode programming.

Figure 6:
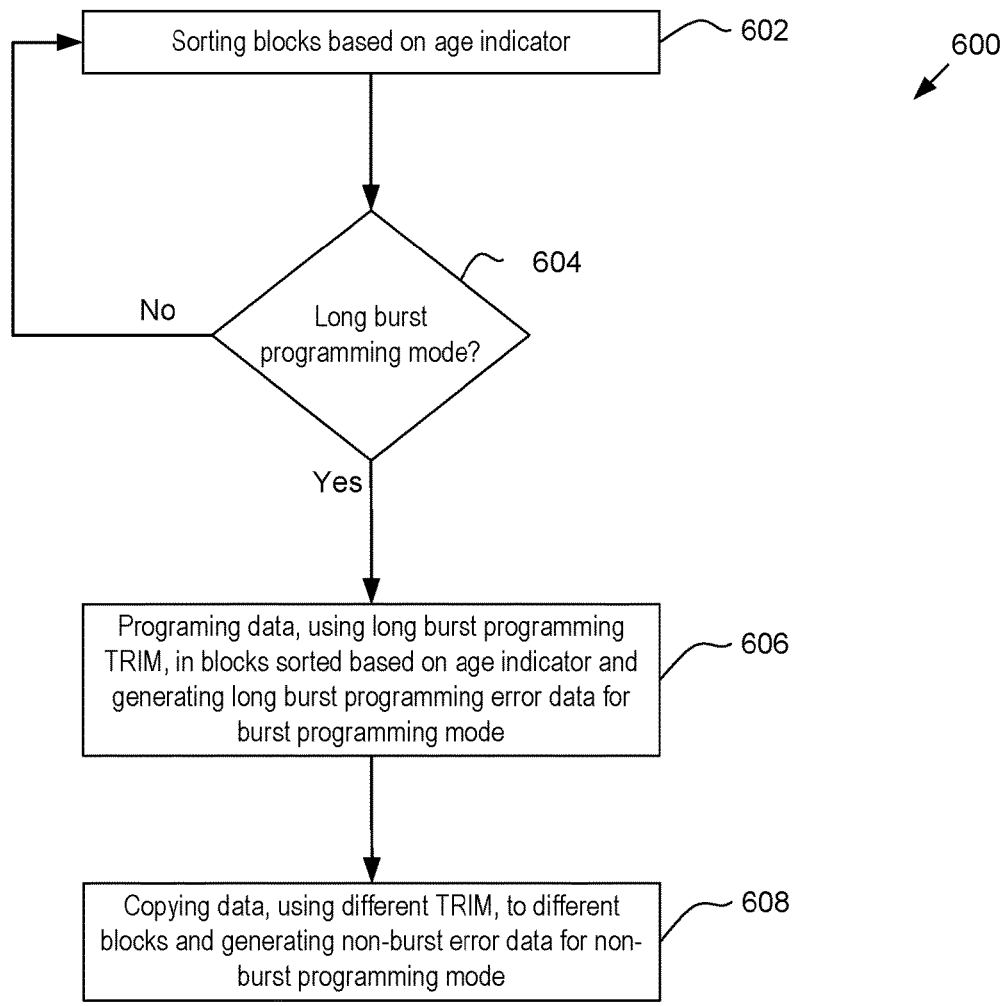
FIG. 6 is a flow chart of an example method of programming data in the burst mode and thereafter copying the programmed data in a non-burst mode.

FIG. 6 is a flow chart 600 of an example method of programming data in the burst mode and thereafter copying the programmed data in a non-burst mode. At 602, blocks are sorted based on an age indicator. As discussed above, various age indicators may be used, such as based on the NLP number and/or the NLE number. At 604, it is determined whether long burst programming mode is desired. As discussed above, there may be different types of burst programming. As one example, a short burst programming mode may comprise burst programming in which the SLC memory, assigned to perform the burst programming, is sufficiently large to program data in the short burst programming mode. As another example, a long burst programming mode may comprise burst programming in which the SLC memory, assigned to perform the burst programming, is not sufficiently large to program all of the data. In this regard, at least a part of the data is programmed in MLC memory during the burst programming mode.

At 606, in response to determining that long burst programming mode is desired, data is programmed, using the long burst programming TRIM, into blocks sorted based on the age indicator and long burst programming error data is generated. As discussed above, various TRIMs may be used for different programming modes. As one example, long burst programming may have an associated long burst programming TRIM. Likewise, short burst programming may have an associated short burst programming TRIM. The one or more parameters of the different TRIMs may be different, such as one, some, or all of the following: Vpgm, dVpgm, or PPW. In a specific embodiment, the long burst programming mode programs into MLC memory.

After which, at 608, the data that was programmed during the long burst programming mode is copied, using different TRIM, and non-burst programming error data is generated. For example, the data may be copied, using a normal mode programming TRIM, to different MLC blocks and normal programming error data may be generated. The normal mode programming TRIM may be different, at least in part, from the long burst programming TRIM.

Figure 7:
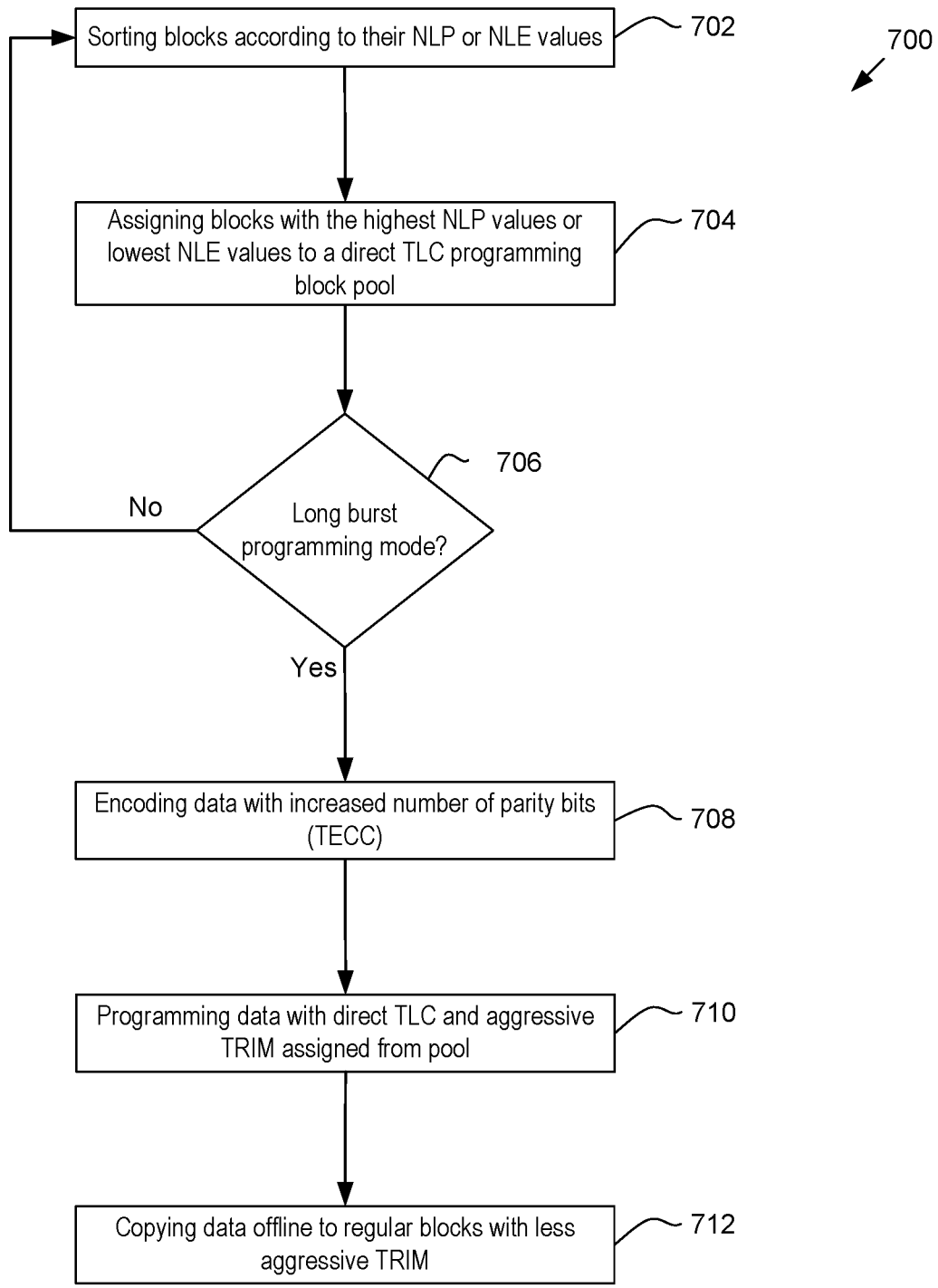
FIG. 7 is a flow chart of an example method of sorting blocks according to age indicators in order to select the sorted blocks for programming directly to TLC in burst mode programming.

FIG. 7 is a flow chart 700 of an example method of sorting blocks according to age indicators in order to select the sorted blocks for programming directly to TLC in burst mode programming. At 702, the free blocks are sorted according to their NLP value or the NLE value. At 704, blocks with the highest NLP values or lowest NLE values are assigned to the direct TLC programming block pool. At 706, it is determined whether long burst programming is desired. If so, at 708, data is encoded with an increased number of parity bits (TECC). In particular, the number of parity bits encoded for long burst programming is greater than encoded during a normal programming mode.

At 710, the data is programmed directly to TLC with an aggressive TRIM assigned from a pool of TRIMs. Thereafter, at 712, the data is copied offline to regular blocks with a less aggressive TRIM than that used at 710.

Figure 8:
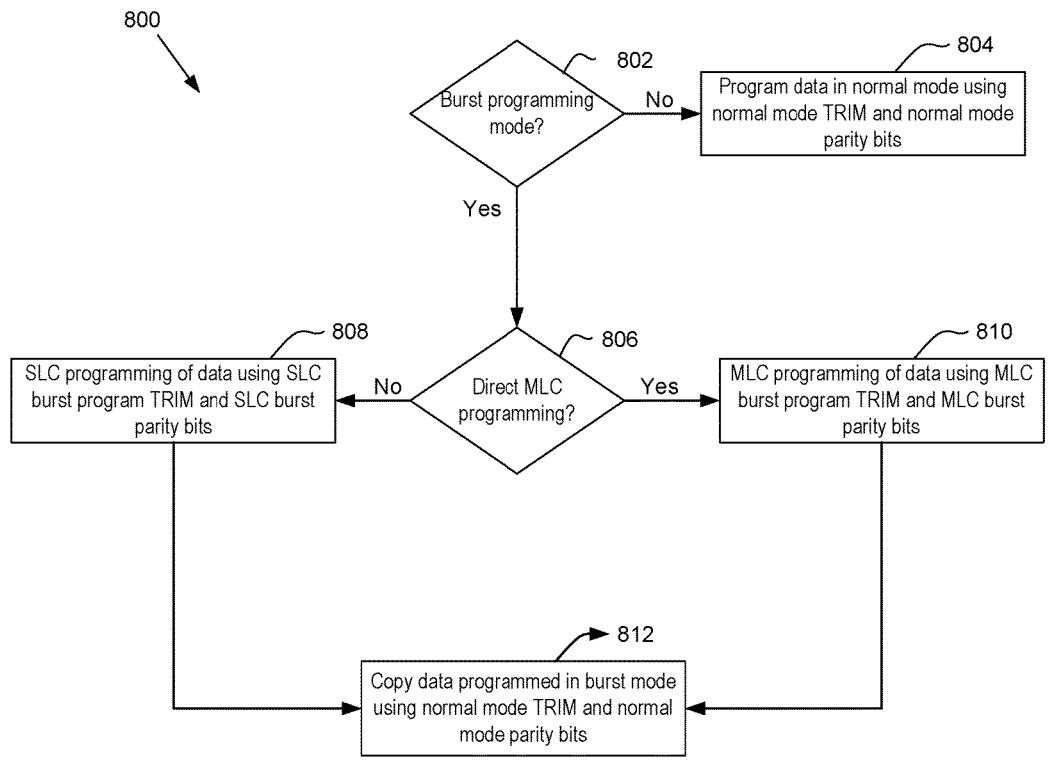
FIG. 8 is a flow chart of an example method of different program criteria (e.g., different TRIM and different numbers of parity bits) in burst mode programming to SLC versus MLC blocks.

FIG. 8 is a flow chart 800 of an example method of different program criteria (e.g., different TRIM and different numbers of parity bits, such as burst mode parity bits) in burst mode programming to SLC versus MLC blocks. At 802, it is determined whether to enter burst programming mode. If not, at 804, the data is programmed in normal mode using a normal mode TRIM and normal mode parity bits (e.g., the number of parity bits used in normal mode). If so, at 806, it is determined whether to directly program to MLC in burst mode. If not, at 808, SLC programming of the data is performed using SLC burst programming TRIM and SLC burst parity bits. If yes, at 810, MLC programming of the data is performed using MLC burst programming TRIM and MLC burst parity bits. As discussed above, MLC burst programming TRIM is more aggressive than the SLC burst programming TRIM (e.g., higher Vpgm and/or wider dVpgm). Further, the MLC burst parity bits are higher in number than the SLC burst parity bits and the normal mode parity bits. After which, at 812, the data programmed in burst mode is copied using normal mode TRIM and normal mode parity bits.

Lastly, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where they direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

The invention claimed is:

1. A non-volatile memory system comprising:
   non-volatile memory;
   a tunable error correction coding (ECC) engine;
   single-level cell (SLC) burst programming circuitry configured to program data in the non-volatile memory at SLC in an SLC burst programming mode and to access the tunable ECC engine to generate SLC burst mode ECC data; and
   multi-level cell (MLC) burst programming circuitry configured to program data in the non-volatile memory at MLC in an MLC burst programming mode and to access the tunable ECC engine to generate MLC burst mode ECC data, wherein the MLC burst programming mode bypasses programming in non-volatile memory at SLC in order to directly program in non-volatile memory at MLC, wherein an amount of the SLC burst mode ECC data is less than an amount of the MLC burst mode ECC data.

2. The non-volatile memory system of claim 1, wherein the SLC burst mode ECC data comprises SLC burst mode parity data;
   wherein the MLC mode ECC data comprises MLC burst mode parity data; and
   wherein a number of bits of the MLC burst mode parity data is greater than a number of bits of the SLC burst mode parity data.

3. The non-volatile memory system of claim 1, wherein the tunable ECC engine is configured to generate the MLC burst mode ECC data dependent on an age indicator of memory blocks used to program the data in MLC in the MLC burst programming mode.

4. The non-volatile memory system of claim 1, wherein the tunable ECC engine is configured to generate ECC data dependent on a burst programming mode programming settings used to program the data in MLC in the MLC burst programming mode.

5. A non-volatile memory system comprising:
   non-volatile memory;
   multi-level cell (MLC) burst programming circuitry configured to program data, using burst programming settings, in a burst programming mode to MLC memory, wherein the burst programming settings comprise a burst Vpgm and a burst dVpgm; and
   normal programming circuitry configured to program data, using normal programming settings, in a normal programming mode to at least a part of the non-volatile memory, wherein the normal programming settings comprise a normal Vpgm and a normal dVpgm;
   wherein the burst Vpgm is different from the normal Vpgm; and
   wherein the burst dVpgm is different from the normal Vpgm.

6. The non-volatile memory system of claim 5, wherein the burst programming settings are different from the normal programming settings such that use of the burst programming settings speeds up programming and widens cell distribution.

7. The non-volatile memory system of claim 6, wherein the burst programming settings comprise a burst Vpgm, a burst dVpgm, a burst skip verify, and a burst program pulse width (PPW);
   wherein the normal programming settings comprises a normal Vpgm, a normal dVpgm, a normal skip verify, and a normal PPW;
   wherein the burst Vpgm is greater than the normal Vpgm;
   wherein the burst dVpgm is greater than the normal dVpgm;
   wherein the burst skip verify is different than the normal skip verify; and
   wherein the burst PPW is different than the normal PPW.

8. The non-volatile memory system of claim 5, further comprising an error correction coding (ECC) engine;
   wherein the ECC engine is configured to generate burst mode parity data in the burst programming mode;
   wherein the ECC engine is configured to generate normal mode parity data in the normal programming mode; and
   wherein an amount of the burst mode parity data is greater than an amount of the normal mode parity data.

9. A non-volatile memory system comprising:
   non-volatile memory;
   block selection circuitry configured to select one or more free blocks, based on age of the one or more free blocks, for burst programming; and
   multi-level cell (MLC) burst programming circuitry configured to program data in the non-volatile memory at MLC in an MLC burst programming mode to the selected one or more free blocks, wherein the MLC burst programming mode bypasses programming in the non-volatile memory at single-level cell (SLC) in order to directly program in the non-volatile memory at MLC.

10. The non-volatile memory system of claim 9, wherein the block selection circuitry is configured to rank the free blocks based on program/erase cycles for respective blocks.

11. The non-volatile memory system of claim 9, wherein the burst programming circuitry is configured to program the data directly to MLC memory.

12. The non-volatile memory system of claim 11, further comprising normal programming circuitry configured to program the data, programmed directly to the MLC memory in burst programming mode, into another section of MLC memory using a normal programming mode, the normal programming mode using different error correction coding (ECC) than used in the burst programming mode.

13. A non-volatile memory system comprising:
    non-volatile memory;
    block selection circuitry configured to select one or more free blocks based on speed of programming; and
    multi-level cell (MLC) burst programming circuitry configured to program data in the non-volatile memory at MLC in an MLC burst programming mode to the selected one or more free blocks, wherein the MLC burst programming mode bypasses programming in the non-volatile memory at single-level cell (SLC) in order to directly program in the non-volatile memory at MLC.

14. The non-volatile memory system of claim 13, wherein the block selection circuitry is configured to rank the free blocks based on a number of programming pulses and to select one or more free blocks that have a higher number of programming pulses.

15. The non-volatile memory system of claim 13, wherein the block selection circuitry is configured to rank the free blocks based on a number of erase pulses and to select one or more free blocks that have a lower number of erase pulses.

16. The non-volatile memory system of claim 13, further comprising normal programming circuitry configured to program the data, programmed directly in the non-volatile memory at MLC in burst programming mode, into another section of MLC memory using a normal programming mode, the normal programming mode using different error correction coding (ECC) than used in the MLC burst programming mode.

17. The non-volatile memory system of claim 13, further comprising normal programming circuitry configured to select one or more blocks for programming the data without consideration of the speed of programming.

18. The non-volatile memory system of claim 1, further comprising MLC normal mode programming circuitry configured to program the data, stored in the non-volatile memory at MLC in the MLC burst programming mode, in the non-volatile memory at MLC in MLC normal programming mode and to access the tunable ECC engine to generate MLC normal mode ECC data;
   wherein the amount of the MLC burst mode ECC data is greater than an amount of the MLC normal mode ECC data; and
   wherein states of the data after the MLC burst programming mode are wider than states of the data after MLC normal programming mode.

19. The non-volatile memory system of claim 9, wherein the block selection circuitry is configured to select the free blocks that are indicative of younger blocks.

20. The non-volatile memory system of claim 9, wherein the block selection circuitry is configured to select the free blocks that are indicative of older blocks.

* * * * *